US012761259B2

(12) United States Patent
Leyba

(10) Patent No.: US 12,761,259 B2
(45) Date of Patent: Oct. 13, 2026

(54) NOISE MARGIN MEASUREMENT OF A REPEATING SIGNAL UNDER TEST (SUT)

(71) Applicant: Keysight Technologies, Inc., Santa Rosa, CA (US)

(72) Inventor: David Leyba, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 146 days.

(21) Appl. No.: 18/813,123

(22) Filed: Aug. 23, 2024

(65) Prior Publication Data

US 2025/0138074 A1 May 1, 2025

Related U.S. Application Data

(60) Provisional application No. 63/546,543, filed on Oct. 31, 2023.

(51) Int. Cl.
*G01R 29/26* (2006.01)
*G01R 13/02* (2006.01)

(52) U.S. Cl.
CPC ......... *G01R 29/26* (2013.01); *G01R 13/0272* (2013.01); *G01R 13/029* (2013.01)

(58) Field of Classification Search
CPC ... G01R 29/26; G01R 13/0272; G01R 13/029
USPC .......................................................... 324/613
See application file for complete search history.

(56) References Cited

U.S. PATENT DOCUMENTS

| | | | |
|---|---|---|---|
| 7,339,509 | B2 | 3/2008 | Woodward et al. |
| 8,332,172 | B2 | 12/2012 | Agoston et al. |
| 9,208,805 | B1 | 12/2015 | Ow et al. |
| 9,608,721 | B2 | 3/2017 | Dawe |

(Continued)

FOREIGN PATENT DOCUMENTS

| | | | |
|---|---|---|---|
| CN | 101518000 | A | 8/2009 |
| CN | 105102992 | A | 11/2015 |
| CN | 105657434 | B | 3/2019 |

OTHER PUBLICATIONS

English translation of CN105657434B, 13 pgs.

(Continued)

*Primary Examiner* — Roberto Velez

(57) ABSTRACT

A test system implemented method is for measuring the noise margin of a repeating signal under test (SUT). The method includes determining a digitizer noise of a digitizer channel of the test system, and applying the repeating SUT to the digitizer channel of the test system. An oversampled equivalent-time waveform representation of the repeating SUT is acquired, and then a filtered waveform representation is obtained. A noise margin om of the repeating SUT is determine in accordance with the equation $\sigma_m=(\sigma_c^2+\sigma_i^2-\sigma_d^2)^{1/2}$, where $\sigma_c$ is a standard deviation of a maximum amount of gaussian noise that can added to the filtered waveform representation without its symbol error rate (SER) exceeding a target value, $\sigma_i$ is a standard deviation of the digitizer noise, and $\sigma_d$ is a standard deviation of the noise components removed to obtain the filter waveform representation.

12 Claims, 5 Drawing Sheets

(56) References Cited

U.S. PATENT DOCUMENTS

| | | | | |
|---|---|---|---|---|
| 9,985,812 | B1 | 5/2018 | Hollender | |
| 11,255,893 | B2 | 2/2022 | Draving | |
| 11,604,213 | B1 | 3/2023 | Draving et al. | |
| 11,821,920 | B1 * | 11/2023 | Viss | G01R 13/0272 |
| 2005/0129152 | A1 | 6/2005 | Hillstrom | |
| 2005/0238094 | A1 | 10/2005 | Bessho et al. | |
| 2014/0100822 | A1 | 4/2014 | Hiltner | |
| 2017/0292977 | A1 | 10/2017 | Pickerd et al. | |
| 2019/0103999 | A1 | 4/2019 | Pickerd et al. | |
| 2019/0227109 | A1 | 7/2019 | Guenther | |
| 2020/0064386 | A1 | 2/2020 | Draving | |
| 2021/0270877 | A1 | 9/2021 | Owen | |
| 2022/0082603 | A1 | 3/2022 | Draving | |
| 2022/0082604 | A1 | 3/2022 | Draving | |
| 2024/0125837 | A1 | 4/2024 | Tan | |
| 2024/0410941 | A1 | 12/2024 | Raiman | |
| 2026/0029451 | A1 * | 1/2026 | Viss | G01R 13/0218 |

OTHER PUBLICATIONS

Jason Breitbarth, "Cross Correlation in Phase noise analysis," Microwave Journal, Feb. 2011, pp. 178-185.

Non-Final Office Action dated Jul. 6, 2022, for U.S. Appl. No. 17/084,232, 20 pgs.

Notice of Allowance dated Dec. 19, 2022, U.S. Appl. No. 17/084,232, 20 pgs.

Supplemental Notice of Allowability dated Feb. 15, 2023, U.S. Appl. No. 17/084,232, 4 pgs.

"PAM4 Signaling in High-Speed Serial Technology: Test, Analysis, and Debug," Tektronix, 2016, www.tek.com, pp. 1-36.

Non-Final Office Action dated Apr. 23, 2026, for U.S. Appl. No. 18/380,948, 31 pgs.

English translation of CN101518000, Aug. 26, 2009. (Year: 2009).

Notice of Allowance dated Oct. 7, 2025, U.S. Appl. No. 18/383,921, 22 pgs.

Restriction Requirement dated Jul. 21, 2022, for U.S. Appl. No. 17/178,691, 8 pgs.

Non-Final Office Action dated Oct. 26, 2022, for U.S. Appl. No. 17/178,691, 23 pgs.

* cited by examiner

NOISE MARGIN MEASUREMENT OF A REPEATING SIGNAL UNDER TEST (SUT)

CROSS-REFERENCE TO RELATED APPLICATION

A claim of priority is made to U.S. Provisional Application No. 63/546,543, filed Oct. 31, 2023, in the U.S. Patent and Trademark Office, the disclosure of which is incorporated herein by reference in its entirety.

BACKGROUND

Oscilloscopes and digitizers measure voltage or power versus time waveforms. There are various parameters of the instrumentation that limit the fidelity of these waveforms including non-linear behavior, non-ideal frequency response, and random noise. While there are many techniques available for correcting deterministic responses such as nonlinearities and non-ideal frequency behavior, the random nature of noise usually requires statistical techniques.

Several techniques exist which aim to deal with undesirable instrument noise, hereafter referred to as "intrinsic noise."

One simple approach is to use averaging to remove the noise, which is applicable to both real-time and equivalent-time oscilloscopes. Multiple acquisitions are combined using simple mathematical averaging to remove the noise and obtain an "averaged" waveform. This is a simple approach, but it is problematic if the signal under test (SUT) also has noise. Usually, it is desirable to maintain SUT noise on the waveform and only remove the intrinsic noise, but averaging removes both SUT and intrinsic noise in a 1/sqrt (N) manner, where N is the number of averages.

Another approach is to quantify the intrinsic noise and then use statistical techniques to remove noise from parametric measurements. For example, the transmitter dispersion eye closure (TDEC) measurement works by overlaying the waveform into an "eye diagram" and then generating histograms at various locations within the eye, as shown in FIG. 1. In the figure, reference number 1 denotes a histogram, reference number 2 denotes histogram windows at the eyes crossing points, and reference number 3 denotes adjustable histogram windows for adjusting a width of the window. OMA (optical modulation amplitude) is the difference between mean powers $P_1$ and $P_2$ in the figure. The measurement is derived from the information in these histograms, including the relationships between the means of the histograms and the tails of the histograms. If the intrinsic noise of the instrument has been characterized in advance, the measurement value can be compensated by incorporating the intrinsic noise value into the calculation of the parametric measurements. This technique is used for a variety of parametric measurements. The drawback of this approach is that the waveform itself has not been corrected, only the measurements, and therefore the visual display still has the undesired noise.

A third approach is based on multiple samplers, as outlined in commonly assigned U.S. Pat. No. 11,604,213, issued Mar. 14, 2023, and U.S. Non-Provisional patent application Ser. No. 17/178,691, filed Feb. 18, 2021. These approaches correct both the visual display and the parametric measurements, but they do require instrument complexity to split and sample the SUT.

A fourth approach that is applicable to equivalent-time oscilloscopes is to oversample the waveform and apply a low-pass filter. As an example, consider FIG. 2 which shows the spectrum of a pulse amplitude modulated signal that has additive white gaussian noise (AWGN). The signal has been sampled at two different sample spacings using equivalent-time sampling. Equivalent-time sampling accurately represents the frequency content of signal components that are synchronous with the trigger (clock) signal, but the frequency content of other components is aliased throughout the equivalent-time spectrum. This includes the random noise present on the signal, both intrinsic noise and SUT noise.

FIG. 2 shows the spectrum of a pulse amplitude modulated signal with AWGN acquired at multiple sample spacings. As the samples per bit increases, the same noise power is spread over a larger frequency range and therefore the noise floor decreases. By increasing the degree of oversampling, the equivalent-time spectrum can be extended to extremely high frequencies, which has the effect of spreading the noise over more frequencies and therefore lowering the noise floor. This is seen in FIG. 2, where the trace taken with 32 samples per bit has a lower noise floor than the trace taken at 16 samples per bit. In the example of FIG. 2, a brick wall filter at 40 GHz would eliminate ½ of the noise power at 16 samples/bit and ¾ the noise power at 32 samples per bit. This is the same noise reduction you would get with 2 and 4 averages, respectively. This low-pass filter technique has the same drawback as averaging: all the noise is removed, not just the intrinsic noise. However, this filter technique is a building-block for the method proposed by this disclosure.

SUMMARY

According to an aspect of the invention concepts, test system implemented method of measuring the noise margin of a repeating signal under test (SUT) is provided. The method includes determining a digitizer noise of a digitizer channel of the test system, applying the repeating SUT to the digitizer channel of the test system, and obtaining an equivalent-time waveform representation of the repeating SUT, where the waveform representation is oversampled such that a Nyquist frequency of the waveform representation is greater than deterministic maximum frequency of the repeating SUT. The method further includes obtaining a filtered waveform representation in which noise components of the equivalent-time waveform representation outside of the deterministic maximum frequency are removed, and determining a noise margin $\sigma_m$ of the repeating SUT in accordance with the following equation, $$\sigma_m = (\sigma_c^2 + \sigma_i^2 - \sigma_d^2)^{1/2}$$

where $\sigma_c$, is a standard deviation of a maximum amount of gaussian noise that can be added to the filtered waveform representation without its symbol error rate (SER) exceeding a target value, $\sigma_i$ is a standard deviation of the digitizer noise, and where $\sigma_d$ is a standard deviation of the noise components removed to obtain the filter waveform representation.

The repeating SUT may be an optical signal.

The test system may be an oscilloscope.

The filtered waveform representation may be obtained by applying the equivalent-time waveform representation to a low-pass filter having a cutoff frequency greater than the deterministic maximum frequency of the repeating SUT.

In the case where $\sigma_d$ is determined to be less than $\sigma_i$ after obtaining the filtered waveform representation, the method may further include returning to the step of obtaining the equivalent-time waveform and increasing the Nyquist frequency.

According to another aspect of the inventive concepts, a test system implemented method of measuring the noise margin of a repeating signal under test (SUT). The method includes determining a digitizer noise of a digitizer channel of the test system, applying the repeating SUT to the digitizer channel of the test system, and acquiring multiple real-time waveform representations of the repeating SUT, wherein the waveform representations are oversampled such that a Nyquist frequency of the waveform representation is greater than deterministic maximum frequency of the repeating SUT. The method further includes averaging the multiple real-time waveform representations to obtain a new waveform, and creating multiple noise sequences by subtracting the new waveform from each of the multiple real-time waveforms. The method still further includes determining a noise margin om of the repeating SUT in accordance with the following equation, $$\sigma_m = \left(\sigma_c^2 + \sigma_i^2 - \sigma_d^2\right)^{1/2}$$

where $\sigma_c$, is a standard deviation of a maximum amount of gaussian noise that can be added to the new waveform representation without its symbol error rate (SER) exceeding a target value, where $\sigma_i$ is a standard deviation of the digitizer noise, and where $\sigma_d$ is a standard deviation of the multiple noise sequences.

The repeating SUT may be an optical signal.

The test system may be an oscilloscope.

In the case where $\sigma_d$ is determined to be less than $\sigma_i$ after obtaining the filtered waveform representation, the method further includes returning to the step of obtaining the equivalent-time waveform and increasing the Nyquist frequency.

According to still another method of the inventive concepts, a non-transitory tangible computer readable medium is provide having stored thereon executable instructions embodied in the computer readable medium that when executed by at least one processor of a test system cause the test system to execute a method of measuring the noise margin of a repeating signal under test (SUT). The method including obtaining an equivalent-time waveform representation of the repeating SUT, where the waveform representation is oversampled such that a Nyquist frequency of the waveform representation is greater than deterministic maximum frequency of the repeating SUT. The method further includes obtaining a filtered waveform representation in which noise components of the equivalent-time waveform representation outside of the deterministic maximum frequency are removed, and determining a noise margin om of the repeating SUT in accordance with the following equation, $$\sigma_m = \left(\sigma_c^2 + \sigma_i^2 - \sigma_d^2\right)^{1/2}$$

where $\sigma_c$, is a standard deviation of a maximum amount of gaussian noise that can be added to the filtered waveform representation without its symbol error rate (SER) exceeding a target value, $\sigma_i$ is a standard deviation of the digitizer noise, and where $\sigma_d$ is a standard deviation of the noise components removed to obtain the filter waveform representation.

The test system may be an oscilloscope, and the non-transitory tangible computer readable medium may be a memory of the oscilloscope.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

Figure 1:
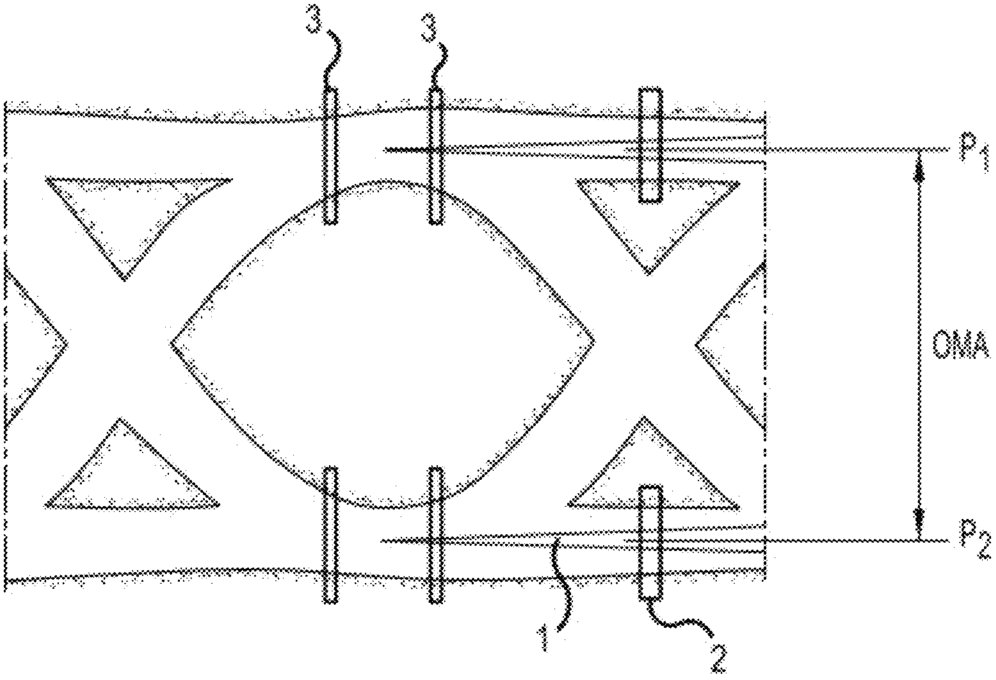
FIG. 1 is an eye diagram for reference in describing transmitter dispersion eye closure (TDEC) measurements.
Figure 2:
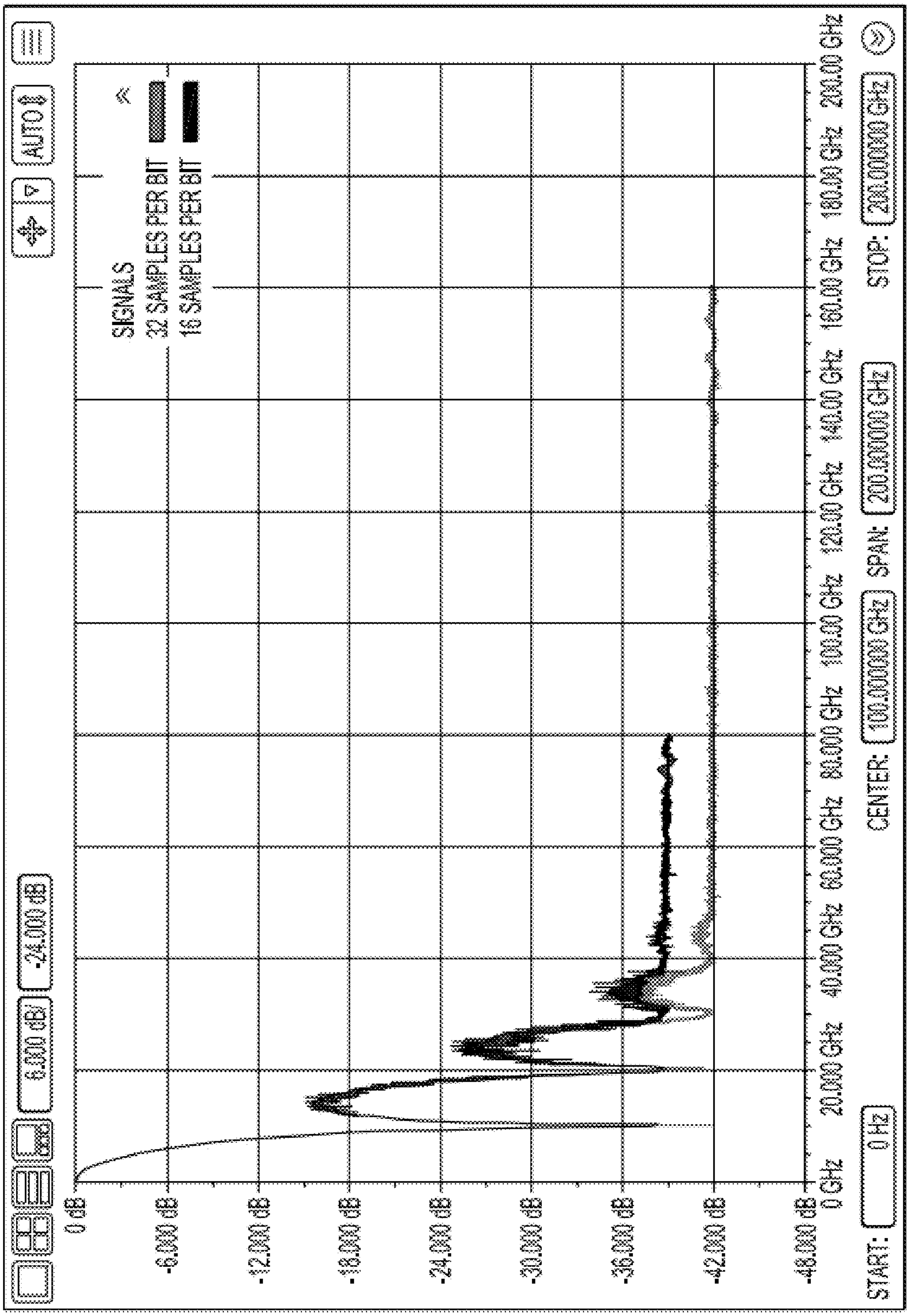
FIG. 2 illustrates an example spectrum of a pulse amplitude modulated signal that has additive white gaussian noise (AWGN)

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the present system. Moreover, for the purpose of clarity, detailed descriptions of certain features will not be discussed when they would be apparent to those with skill in the art so as not to obscure the description of the present system. The following detailed description is therefore not to be taken in a limiting sense, and the scope of the present system is defined only by the appended claims.

As is traditional in the field of the inventive concepts, embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 3:
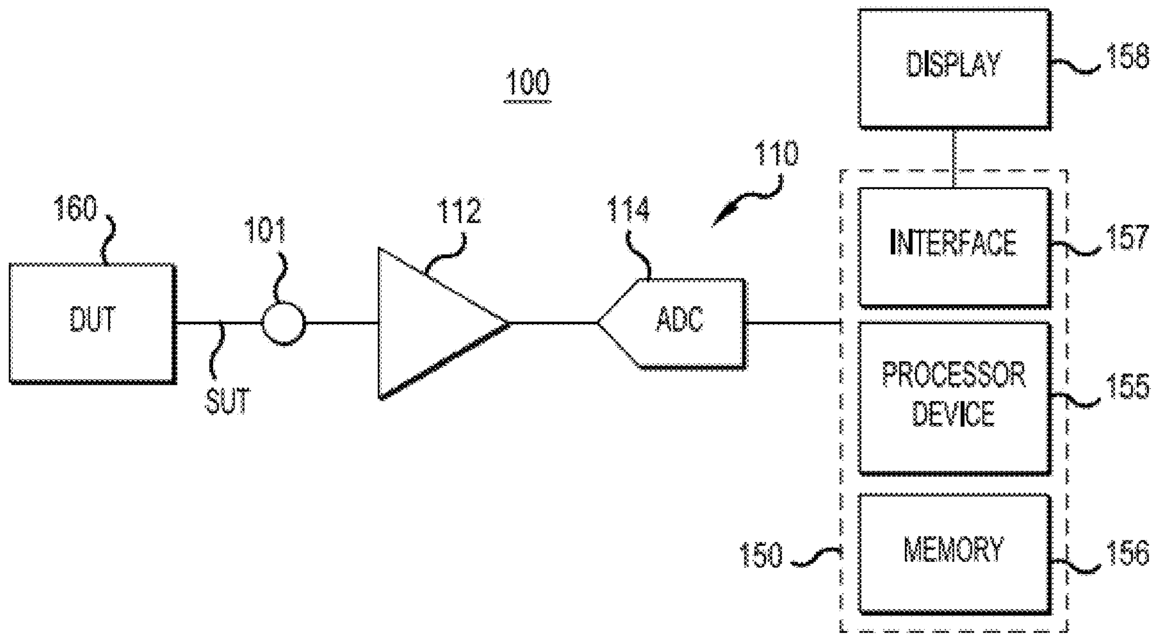
FIG. 3 is a block diagram of a test system according to embodiments of the inventive concepts.

FIG. 3 is a simplified block diagram of a test system for making measurements of a signal under test (SUT), according to a representative embodiment. In the embodiments, the SUT is a repeating SUT.

As examples, the test system 100 may be an oscilloscope or a digital communication analyzer (DCA) having at least one input channel 110. Hereinbelow it is assumed for descriptive purposes that the test system 100 is an oscilloscope, but the inventive concepts are not limited in this fashion.

The oscilloscope 100 of some embodiments is an equivalent-time sampling oscilloscope. The oscilloscope 100 of some other embodiments is a real-time sampling oscilloscope.

The input channel 110 includes a first port 101, an analog pre-processing circuit 112 and an analog-to-digital convertor (ADC) (or digitizer) 114. Generally, the analog pre-processing circuit 112 includes a combination of an attenuator, a dc offset circuit, and an amplifier which optimize the analog properties of a signal under test (SUT) for input the ADC 114.

The oscilloscope 100 receives the SUT output by a DUT 160 at a port of the channel 110, where the SUT may be generated by the DUT 160 or output by the DUT 160 in response to a stimulus signal. The SUT as it is output by the DUT 160 may be an optical signal. In any event, after pre-processing by the analog preprocessing circuit, the SUT is applied to the ADC 114 where it is repeatedly sampled and digitized.

The oscilloscope 100 further includes a processing unit 150 for processing the digitized SUT, performing various measurements, displaying waveforms of the SUT and/or measurement results, and controlling the processes performed by the oscilloscope 100, as discussed below.

The processing unit 150 includes a processor 155, memory 156, and an interface 157, for example, for interface with a display 158. The processor 155, together with the memory 156, implements the methods of removing intrinsic noise from a repeating signal under test (SUT) discussed below. In various embodiments, the processor 155 may include one or more computer processors, digital signal processors (DSPs), field-programmable gate arrays (FPGAs), application specific integrated circuits (ASICs), or combinations thereof, using any combination of hardware, software, firmware, hard-wired logic circuits, or combinations thereof. The processor 155 may include its own processing memory (e.g., memory 156) for storing computer readable code (e.g., software, software modules) that enables performance of the various functions described herein. For example, the memory 156 may store software instructions/computer readable code executable by the processor 155 (e.g., computer processor) for performing some or all aspects of methods described herein.

References to the processor 155 may be interpreted to include one or more processing cores, as in a multi-core processor. The processor 155 may also refer to a collection of processors within a single computer system or distributed among multiple computer systems, as well as a collection or network of computing devices each including a processor or processors. Programs have software instructions performed by one or multiple processors that may be within the same computing device or which may be distributed across multiple computing devices.

The processing memory, as well as other memories and databases, are collectively represented by the memory 156, and may be random-access memory (RAM), read-only memory (ROM), flash memory, electrically programmable read-only memory (EPROM), electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, Blu-ray disk, or universal serial bus (USB) driver, or any other form of storage medium known in the art, which are tangible and non-transitory storage media (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user Interface and/or a network interface for providing information and data output by the processor 155 and/or the memory 156 to the user and/or for receiving information and data input by the user. That is, the interface 157 enables the user to enter data and to control or manipulate aspects of the process of measuring RF signals, and also enables the processor 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 150.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor 155 may include one or more display interface(s), in which case the display 158 may provide a graphical user interface (GUI) for displaying and receiving information to and from a user.

Figure 4:
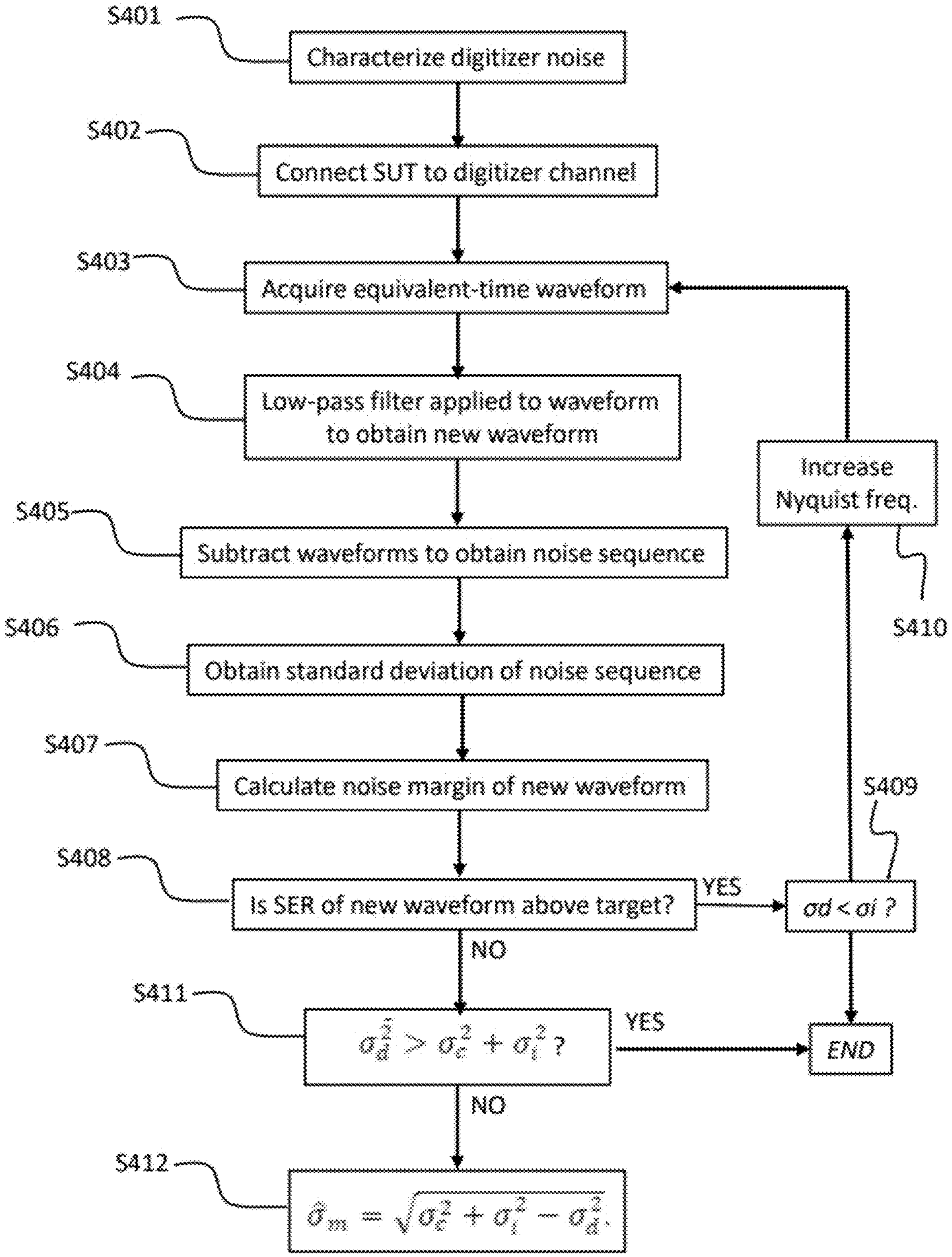
FIG. 4 is a flow chart for reference in describing a method of measuring the noise margin of a signal under test (SUT) according to embodiments of the inventive concepts.

FIG. 4 is a flow diagram for reference in describing a method of measuring a noise margin of a SUT according to a representative embodiment. The method may be implemented by the processing unit 150, for example, where the method steps are provided as instructions stored in the memory 156 and executable by the processor 155. As mentioned previously, the SUT has a repeating waveform pattern.

The method of FIG. 4 is aimed to accurately assess/measure the noise margin of signal under test (SUT) at a target symbol error rate (SER) when the intrinsic noise of the channel increases the SER of the SUT beyond the target. A noise margin measurement is defined as the standard deviation, σ, of a gaussian noise signal that can be added to the SUT and still achieve a SER less than or equal to the target SER. The noise margin measurement removes the effect of the intrinsic noise, o-j, of the channel at the end of the measurement as $\sigma_m=(\sigma^2+\sigma_i^2)^{1/2}$. Noise margin is an intermediate step in the calculation of TDECQ for optical transceivers as described in the IEEE 802.3 ethernet standard.

The repeating SUT is comprised of band-limited deterministic frequency content as well as random noise. The maximum deterministic component is designated herein as Fbw. The noise is approximated as having a Gaussian distribution and can be quantified by a standard deviation, σsut.

In the meantime, the digitizer 114 contributes undesirable intrinsic noise which may increase the SER of the SUT beyond the target SER. Herein, this noise is approximated as having a Gaussian distribution and is quantified by a standard deviation, $\sigma_i$.

Referring collectively to FIGS. 3 and 4, a method of removing intrinsic noise from the digitized waveform of a repeating signal under test (SUT) will be described.

At at S401, the digitizer noise is characterized. This can be done by acquiring a waveform with the SUT disabled or disconnected, and may be done across all digitizer/instrument configurations that influence the magnitude of the intrinsic noise. After this step, σi is known.

At S402, the DUT 160 is connected to the port 101 to apply the repeating SUT to the digitizer channel 110. In this embodiment, the digitizer (or ADC) 114 is capable of acquiring an equivalent-time waveform representation of the repeating SUT.

At S403, an equivalent-time waveform representation Wd of the SUT is obtained by the digitizer. This representation includes the deterministic content of the SUT as well as the device noise σsut and the intrinsic noise σi. The waveform representation is "oversampled" such that the Nyquist frequency of Wd is greater than Fbw. In practice, the Nyquist frequency may be much larger than Fbw.

A lower-pass filter is constructed with cutoff frequency Fc chosen such that Fc>Fbw. The filter has magnitude response of zero at frequencies above Fc and response 1 at frequencies below Fc.

At S404, The low-pass filter is applied to the waveform Wd to obtain a new waveform, Wc with all noise components that have aliased to frequencies >Fbw removed.

At S405, a noise sequence, Nd, is created by subtracting the new waveform Wc from waveform Wd, and at S406 the standard deviation of Nd, designated as ad, is calculated. This is the magnitude of the noise removed from Wd to get Wc. Note that this removed noise includes both SUT noise and intrinsic noise.

At S407, the noise margin of the noise removed signal Wc, which is designated as $\sigma_c$, is calculated as the standard deviation of the maximum amount of gaussian noise that can be added to Wc without its SER exceeding the target SER value.

At S408, a determination is made as to whether the SER of the new waveform Wc is above the target before adding any noise. If YES, the noise margin cannot be measured. However, if $\sigma_d<\sigma_i$ (YES at S409), then it is possible that the noise margin can be measured if the waveform Wd is acquired with a higher Nyquist frequency. In this case, the Nyquist frequency is increased at S410, and the process returns to S403 to acquire a new equivalent-time waveform. Otherwise, in the case where $\sigma_d>\sigma_i$ (NO at 8409), the noise margin cannot be measured and the process ends.

At S411, a determination is made as to whether the condition $\sigma_d^2>\sigma_c^2+\sigma_i^2$ is satisfied. If YES, there does not exist a noise margin because the SUT has a SER greater than the target SER. In this case, the process ends.

On the other hand, if the condition of S411 is not satisfied, the final noise margin of the SUT can be calculated as:

$$\sigma_m = \left(\sigma_c^2 + \sigma_i^2 - \sigma_d^2\right)^{1/2}$$

Figure 5:
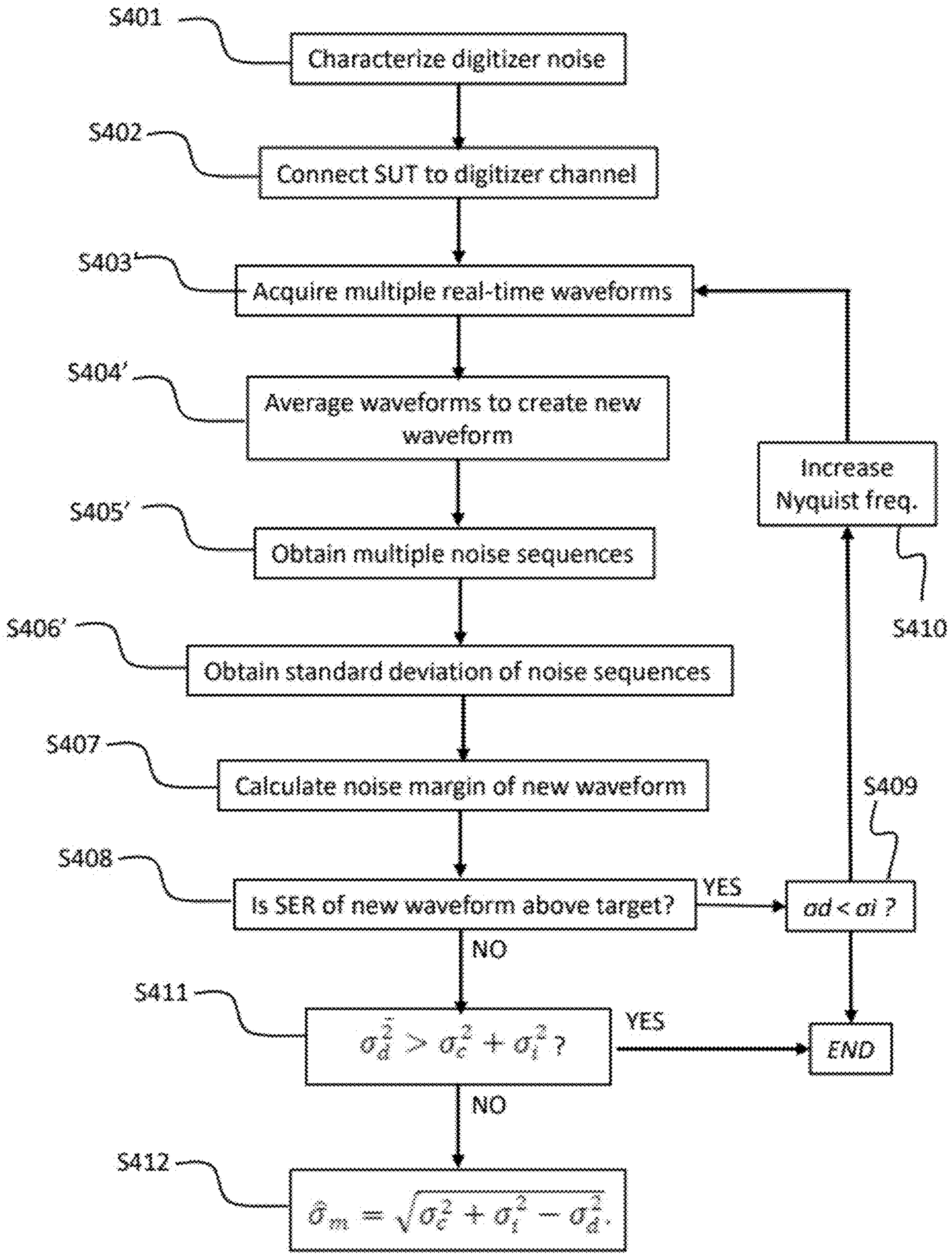
FIG. 5 is a flow chart for reference in describing a method of measuring the noise margin of a signal under test (SUT) according to embodiments of the inventive concepts.

As described above, the embodiment of FIG. 4 may be executed by an equivalent-time sampling oscilloscope. FIG. 5 is a flow diagram illustrating a method that may be executed by a real-time sampling oscilloscope.

Referring to FIG. 5, instead of acquiring an equivalent-time waveform (S403 of FIG. 4), several real-time waveforms acquired at S403'. These real-time waveforms may then be averaged to create a waveform We at S404'. Several noise sequences can then be created at S405' by subtracting We from each of the waveforms used for averaging. A standard deviation can then be calculated at S406' for the ensemble of noise sequences and used as cd in the final calculations. The remaining steps of FIG. 5 are the same as those of FIG. 4 described previously, and thus a detailed description of those steps is omitted here to avoid redundancy.

Embodiments of the inventive concepts encompass non-transitory tangible computer-readable mediums imbedded with instructions to perform the functions, tasks, methods, actions, and/or other operational features described herein for the above-disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, and/or any other non-transitory tangible computer-readable mediums. The non-transitory computer readable medium has stored thereon executable instructions embodied in the computer readable medium that when executed by at least one processor of a test system cause the test system to perform steps to remove intrinsic noise from a waveform representation of a repeating signal under test (SUT) as described above.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A test system implemented method of measuring the noise margin of a repeating signal under test (SUT), comprising:

determining a digitizer noise of a digitizer channel of the test system;

applying the repeating SUT to the digitizer channel of the test system;

acquiring an equivalent-time waveform representation of the repeating SUT, wherein the waveform representation is oversampled such that a Nyquist frequency of the waveform representation is greater than deterministic maximum frequency of the repeating SUT;

obtaining a filtered waveform representation in which noise components of the equivalent-time waveform representation outside of the deterministic maximum frequency are removed, and determining a noise margin $\sigma_m$ of the repeating SUT in accordance with the following equation, $$\sigma_m = (\sigma_c^2 + \sigma_i^2 - \sigma_d^2)^{1/2}$$

where $\sigma_c$, is a standard deviation of a maximum amount of gaussian noise that can added to the filtered waveform representation without its symbol error rate (SER) exceeding a target value;

where $\sigma_i$ is a standard deviation of the digitizer noise, and where $\sigma_d$ is a standard deviation of the noise components removed to obtain the filter waveform representation.

2. The method of claim 1, wherein the repeating SUT is an optical signal.

3. The method of claim 1, wherein the test system is an oscilloscope.

4. The method of claim 1, wherein the filtered waveform representation is obtained by applying the equivalent-time waveform representation to a low-pass filter having a cutoff frequency greater than the deterministic maximum frequency of the repeating SUT.

5. The method of claim 1, wherein in the case where $\sigma_d$ is determined to be less than $\sigma_i$ after obtaining the filtered waveform representation, returning to the step of obtaining the equivalent-time waveform and increasing the Nyquist frequency.

6. A test system implemented method of measuring the noise margin of a repeating signal under test (SUT), comprising:

determining a digitizer noise of a digitizer channel of the test system;

applying the repeating SUT to the digitizer channel of the test system;

acquiring multiple real-time waveform representations of the repeating SUT, wherein the waveform representations are oversampled such that a Nyquist frequency of the waveform representation is greater than deterministic maximum frequency of the repeating SUT;

averaging the multiple real-time waveform representations to obtain a new waveform;

creating multiple noise sequences by subtracting the new waveform from each of the multiple real-time waveforms; and determining a noise margin om of the repeating SUT in accordance with the following equation, $$\sigma_m = (\sigma_c^2 + \sigma_i^2 - \sigma_d^2)^{1/2}$$

where $\sigma_c$, is a standard deviation of a maximum amount of gaussian noise that can added to the new waveform representation without its symbol error rate (SER) exceeding a target value;

where $\sigma_i$ is a standard deviation of the digitizer noise, and where $\sigma_d$ is a standard deviation of the multiple noise sequences.

7. The method of claim 6, wherein the repeating SUT is an optical signal.

8. The method of claim 6, wherein the test system is an oscilloscope.

9. The method of claim 6, wherein in the case where $\sigma_d$ is determined to be less than $\sigma_i$ after obtaining the filtered waveform representation, returning to the step of obtaining the equivalent-time waveform and increasing the Nyquist frequency.

10. A non-transitory tangible computer readable medium having stored thereon executable instructions embodied in the computer readable medium that when executed by at least one processor of a test system cause the test system to execute a method of measuring the noise margin of a repeating signal under test (SUT), the method including:

acquiring an equivalent-time waveform representation of the repeating SUT, wherein the waveform representation is oversampled such that a Nyquist frequency of the waveform representation is greater than deterministic maximum frequency of the repeating SUT;

obtaining a filtered waveform representation in which noise components of the equivalent-time waveform representation outside of the deterministic maximum frequency are removed, and determining a noise margin $\sigma_m$ of the repeating SUT in accordance with the following equation, $$\sigma_m = (\sigma_c^2 + \sigma_i^2 - \sigma_d^2)^{1/2}$$

where $\sigma_c$, is a standard deviation of a maximum amount of gaussian noise that can added to the filtered waveform representation without its symbol error rate (SER) exceeding a target value;

where $\sigma_i$ is a standard deviation of a digitizer noise of the test system, and where $\sigma_d$ is a standard deviation of the noise components removed to obtain the filter waveform representation.

11. The non-transitory tangible computer readable medium of claim 10, wherein the test system is an oscilloscope.

12. The non-transitory tangible computer readable medium of claim 11, wherein the non-transitory tangible computer readable medium is a memory of the oscilloscope.

* * * * *